(12) United States Patent
Kuo et al.

(10) Patent No.: US 11,271,154 B2
(45) Date of Patent: Mar. 8, 2022

(54) MAGNETIC TUNNEL JUNCTION (MTJ) DEVICE

(71) Applicant: UNITED MICROELECTRONICS CORP., Hsin-Chu (TW)

(72) Inventors: Chih-Wei Kuo, Tainan (TW);
Ting-Hsiang Huang, Tainan (TW);
Yu-Tsung Lai, Tainan (TW);
Jiunn-Hsiung Liao, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/529,740

(22) Filed: Aug. 1, 2019

(65) Prior Publication Data
US 2021/0013395 A1    Jan. 14, 2021

(30) Foreign Application Priority Data

Jul. 12, 2019    (TW) .................................. 108124619

(51) Int. Cl.
*H01L 45/00* (2006.01)
*H01L 43/02* (2006.01)
*H01L 41/297* (2013.01)

(52) U.S. Cl.
CPC ........ *H01L 45/1253* (2013.01); *H01L 41/297* (2013.01); *H01L 43/02* (2013.01); *H01L 45/1233* (2013.01); *H01L 45/16* (2013.01)

(58) Field of Classification Search
CPC ... H01L 43/02; H01L 41/297; H01L 45/1253; H01L 45/1233; H01L 45/16
See application file for complete search history.

(56) References Cited

U.S. PATENT DOCUMENTS

| 8,917,531 | B2 | 12/2014 | Annunziata |
| 2007/0164381 | A1 | 7/2007 | Ho |
| 2007/0284748 | A1* | 12/2007 | Woo ................. H01L 23/53295 |
| | | | 257/758 |
| 2008/0205126 | A1* | 8/2008 | Kajiyama ........... G11C 11/1675 |
| | | | 365/158 |
| 2013/0062773 | A1 | 3/2013 | Chen |
| 2014/0070162 | A1 | 3/2014 | Iwayama |
| 2014/0284738 | A1 | 9/2014 | Nakazawa |
| 2015/0069480 | A1 | 3/2015 | Kanaya |
| 2015/0171314 | A1 | 6/2015 | Li |
| 2017/0148727 | A1 | 5/2017 | Do |
| 2018/0342556 | A1* | 11/2018 | Tan ......................... H01L 28/60 |
| 2019/0206877 | A1 | 7/2019 | Kim |

FOREIGN PATENT DOCUMENTS

KR    10-2004-0061265 A    7/2004

* cited by examiner

*Primary Examiner* — Feifei Yeung Lopez
(74) *Attorney, Agent, or Firm* — Winston Hsu

(57) ABSTRACT

A magnetic tunnel junction (MTJ) device includes two magnetic tunnel junction elements and a metal interconnection. The two magnetic tunnel junction elements are arranged side by side at a first direction. The metal interconnection is disposed between the magnetic tunnel junction elements, wherein the metal interconnection includes a contact plug part having a long shape at a top view, and the long shape has a length at a second direction larger than a width at the first direction, wherein the second direction is orthogonal to the first direction.

10 Claims, 6 Drawing Sheets

MAGNETIC TUNNEL JUNCTION (MTJ) DEVICE

BACKGROUND OF THE INVENTION

1. Field of the Invention

The present invention relates generally to a magnetic tunnel junction (MTJ) device, and more specifically to a magnetic tunnel junction (MTJ) device including a metal interconnection having a long shape at a top view.

2. Description of the Prior Art

Magnetoresistive random access memory (MRAM) is a type of memory device containing an array of MRAM cells that store data using resistance values instead of electronic charges. Each MRAM cell includes a magnetic tunnel junction (MTJ) unit whose resistance can be adjusted to represent a logic state "0" or "1."

Conventionally, the magnetic tunnel junction (MTJ) unit is comprised of a fixed magnetic layer, a free magnetic layer, and a tunnel layer disposed there between. The resistance of the magnetic tunnel junction (MTJ) unit can be adjusted by changing a direction of a magnetic moment of the free magnetic layer with respect to that of the fixed magnetic layer. When the magnetic moment of the free magnetic layer is parallel to that of the fixed magnetic layer, the resistance of the magnetic tunnel junction (MTJ) unit is low, whereas when the magnetic moment of the free magnetic layer is anti-parallel to that of the fixed magnetic layer, the resistance of the magnetic tunnel junction (MTJ) unit is high. The magnetic tunnel junction (MTJ) unit is coupled between top and bottom electrodes, and an electric current flowing through the magnetic tunnel junction (MTJ) from one electrode to another can be detected to determine the resistance, and therefore the logic state of the magnetic tunnel junction (MTJ).

SUMMARY OF THE INVENTION

The present invention provides a magnetic tunnel junction (MTJ) device, which includes a metal interconnection having a long shape at a top view between two magnetic tunnel junction elements, thereby enlarging the distance between the metal interconnection and the magnetic tunnel junction elements, while maintaining the contact area at an interface of the metal interconnection. This can avoid short circuit as well as keep low contact resistance.

The present invention provides a magnetic tunnel junction (MTJ) device including two magnetic tunnel junction elements and a metal interconnection. The two magnetic tunnel junction elements are arranged side by side at a first direction. The metal interconnection is disposed between the two magnetic tunnel junction elements, wherein the metal interconnection includes a contact plug part, the contact plug part has a long shape at a top view, and the long shape has a length at a second direction larger than a width at the first direction, wherein the second direction is orthogonal to the first direction.

The present invention provides a magnetic tunnel junction (MTJ) device including two magnetic tunnel junction elements and a metal interconnection. The two magnetic tunnel junction elements are arranged side by side at a first direction. The metal interconnection including a contact plug part and a metal part stacked from bottom to top is disposed between the two magnetic tunnel junction elements, wherein the whole contact plug part overlaps the metal part at a top view, and the minimum distance between an edge of the contact plug part and an edge of the metal part at the first direction is equal to or larger than ⅕ of a length of the metal part at the first direction.

According to the above, the present invention provides a magnetic tunnel junction (MTJ) device, which includes two magnetic tunnel junction elements arranged side by side at a first direction, and a metal interconnection disposed between the two magnetic tunnel junction elements. In one case, the metal interconnection includes a contact plug part, and the contact plug part has a long shape at a top view, wherein the long shape has a length at a second direction larger than a width at the first direction, wherein the second direction is orthogonal to the first direction. In another case, the metal interconnection includes a contact plug part and a metal part stacked from bottom to top, wherein the whole contact plug part overlaps the metal part at the top view, and the minimum distance between an edge of the contact plug part and an edge of the metal part at the first direction is equal to or larger than ⅕ of a length of the metal part at the first direction. In this way, the distance between the contact plug part and the adjust magnetic tunnel junction elements can be enlarged to avoid short circuit, and the surface area of the contact plug part can also be maintained to keep low contact resistance.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
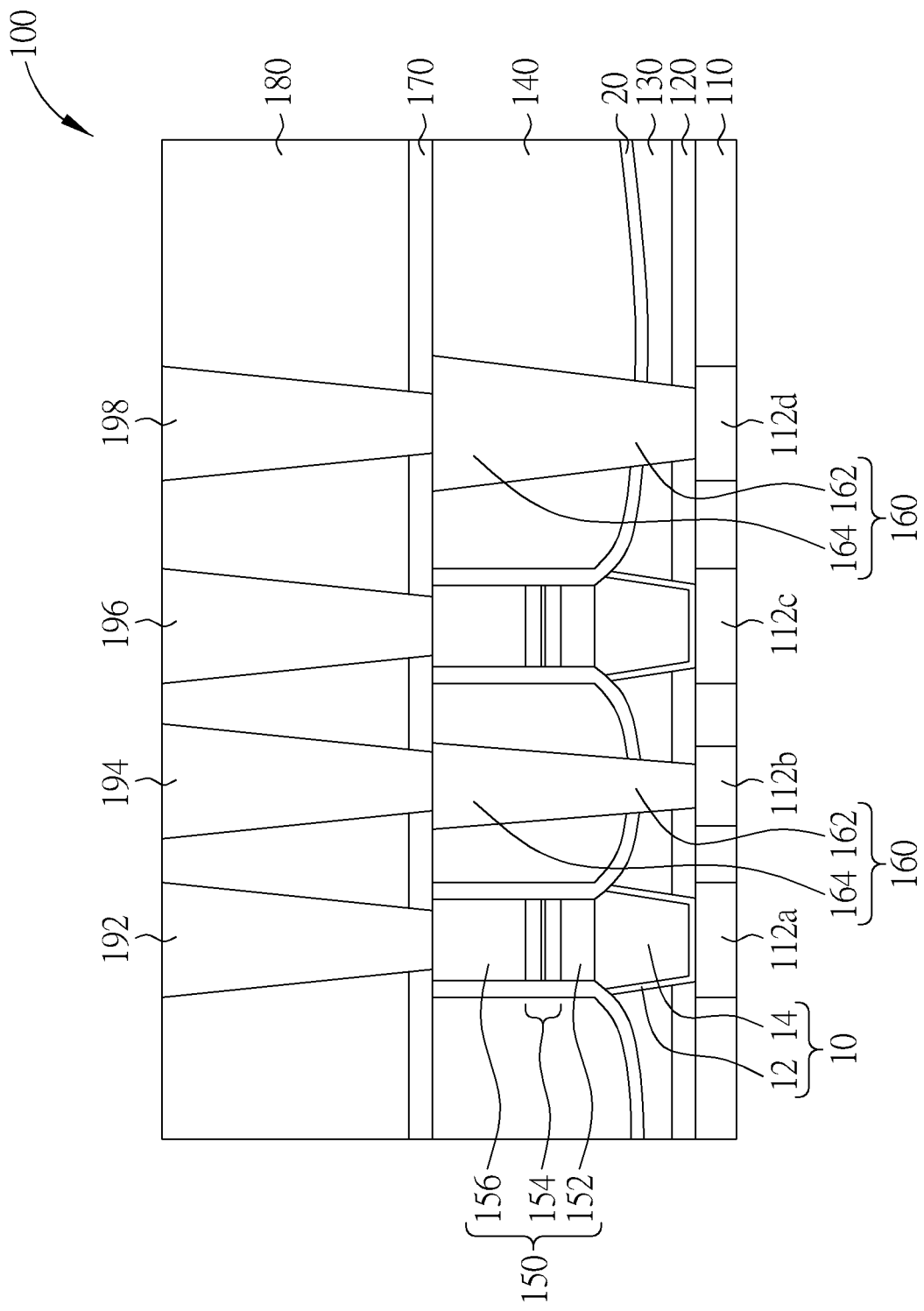
FIG. 1 schematically depicts a cross-sectional view of a magnetic tunnel junction (MTJ) device according to an embodiment of the present invention.

FIG. 1 schematically depicts a cross-sectional view of a magnetic tunnel junction (MTJ) device according to an embodiment of the present invention. As shown in FIG. 1, a dielectric layer 110 is formed on a substrate (not shown), wherein the dielectric layer 110 may be an oxide layer, which may be an inter-metal dielectric layer, but it is not limited thereto. The dielectric layer 110 is depicted only in a magnetoresistive random access memory area in this embodiment, and magnetoresistive random access memory cells are in the magnetoresistive random access memory area. Furthermore, the dielectric layer 110 may be formed in other not depicted areas such as logic areas and alignment mark areas etc. A plurality of metal lines 112a/112b/112c/112d are formed in the dielectric layer 110 to connect to above magnetic tunnel junction (MTJ) devices and metal interconnections. The four metal lines 112a/112b/112c/112d are depicted in the diagrams, but the number of the metal lines 112a/112b/112c/112d is not restricted thereto. The metal lines 112a/112b/112c/112d may include copper, and a barrier layer (not shown) may surround each of the metal lines 112a/112b/112c/112d, wherein the barrier layer may be a tantalum nitride layer, but it is not limited thereto.

A cap layer 120 and a first dielectric layer 130 are sequentially formed on the dielectric layer 110, and contact plugs 10 are in the first dielectric layer 130 and the cap layer 120 and connect to the metal lines 112a/112c. The cap layer 120 may be a carbon containing nitride layer, while the first dielectric layer 130 may be an oxide layer, but it is not limited thereto. Methods of forming the cap layer 120 and the first dielectric layer 130 may include the following steps. A cap layer (not shown) and a first dielectric layer (not shown) may blanketly cover the dielectric layer 110, the cap layer and the first dielectric layer are patterned to form recesses (not shown) in the cap layer 120 and the first dielectric layer 110 and expose the metal lines 112a/112c, and then the contact plugs 10 fill up the recesses, wherein each of the contact plugs 10 may include a barrier layer 12 and a metal 14. Methods of forming the barrier layers 12 and the metals 14 fill up the recesses may include: forming a barrier layer (not shown) conformally covering the recesses and the first dielectric layer 130, a metal (not shown) filling up the recesses, removing the metal and the barrier layer exceeding from the recesses by a planarization process to form the barrier layers 12 and the metals 14, wherein the barrier layers 12 surround the metals 14. The barrier layers 12 may be titanium layers, titanium nitride layers or titanium/titanium nitride layers, and the metals 14 may be tungsten, but it is not limited thereto.

A second dielectric layer 140 is formed on the first dielectric layer 130, and magnetic tunnel junction elements 150 are formed in the second dielectric layer 140. More precisely, a seeding layer (not shown), a magnetic tunneling junction layer (not shown) and a top electrode layer (not shown) are deposited to cover the contact plugs 10 and the first dielectric layer 130. Then, the top electrode layer, the magnetic tunneling junction layer and the seeding layer are patterned to form the magnetic tunnel junction elements 150. Each of the magnetic tunnel junction elements 150 may include a seeding layer 152, a magnetic tunneling junction 154 and a top electrode 156. The seeding layer 152 may be a tantalum nitride layer, and the magnetic tunneling junction 154 may include multilayers, which may be composed by an insulating layer sandwiched by two ferromagnetic material layers, called magnetic tunnel junction (MTJ). The resistance of the magnetic tunnel junction (MTJ) unit can be adjusted by changing a direction of a magnetic moment of the free magnetic layer (one of the ferromagnetic material layer) with respect to that of the fixed magnetic layer (the other of the ferromagnetic material layer). When the magnetic moment of the free magnetic layer is parallel to that of the fixed magnetic layer, the resistance of the magnetic tunnel junction (MTJ) unit is low, whereas when the magnetic moment of the free magnetic layer is anti-parallel to that of the fixed magnetic layer, the resistance of the magnetic tunnel junction (MTJ) unit is high. The top electrode 156 may be a metal such as tungsten.

Thereafter, a cap layer (not shown) and a second dielectric layer (not shown) may blanketly cover the magnetic tunnel junction elements 150 and the first dielectric layer 130, and then the second dielectric layer and the cap layer may be planarized to form a cap layer 20 covering the first dielectric layer 130 and sidewalls of the magnetic tunnel junction elements 150, and the second dielectric layer 140 covering the cap layer 20 but exposing the top electrodes 156 of the magnetic tunnel junction elements 150. The cap layer 20 may be a nitride layer while the second dielectric layer 140 may be an oxide layer, but it is not limited thereto.

A dual damascene process may be performed to form metal interconnections 160 in the second dielectric layer 140 between the magnetic tunnel junction elements 150, and directly contacting the metal lines 112b/112d. Each of the metal interconnections 160 may include a contact plug part 162 and a metal part 164 stacked from bottom to top. In this embodiment, the contact plug part 162 and the metal part 164 have tapered sidewalls broaden smoothly from bottom to top. In other embodiments, as shown in FIG. 2, each of the metal interconnections 160a may include a contact plug part 162a and a metal part 164a stacked from bottom to top, and the contact plug part 162a and the metal part 164a may have a curved connecting part, depending upon practical requirements.

A cap layer 170 and a third dielectric layer 180 are formed on the dielectric layer 140, the magnetic tunnel junction elements 150 and the metal interconnections 160, and metal interconnections 192/194/196/198 are formed in the third dielectric layer 180 and the cap layer 170, wherein the metal interconnections 192/196 directly contact the magnetic tunnel junction elements 150 while the metal interconnections 194/198 directly contact the metal interconnections 160. More precisely, a cap layer (not shown) and a third dielectric layer (not shown) may blanketly cover the dielectric layer 140, the magnetic tunnel junction elements 150 and the metal interconnections 160; the third dielectric layer and the cap layer are patterned to form recesses and expose the magnetic tunnel junction elements 150 and the metal interconnections 160; and then, the metal interconnections 192/194/196/198 fill into the recesses.

Figure 2:
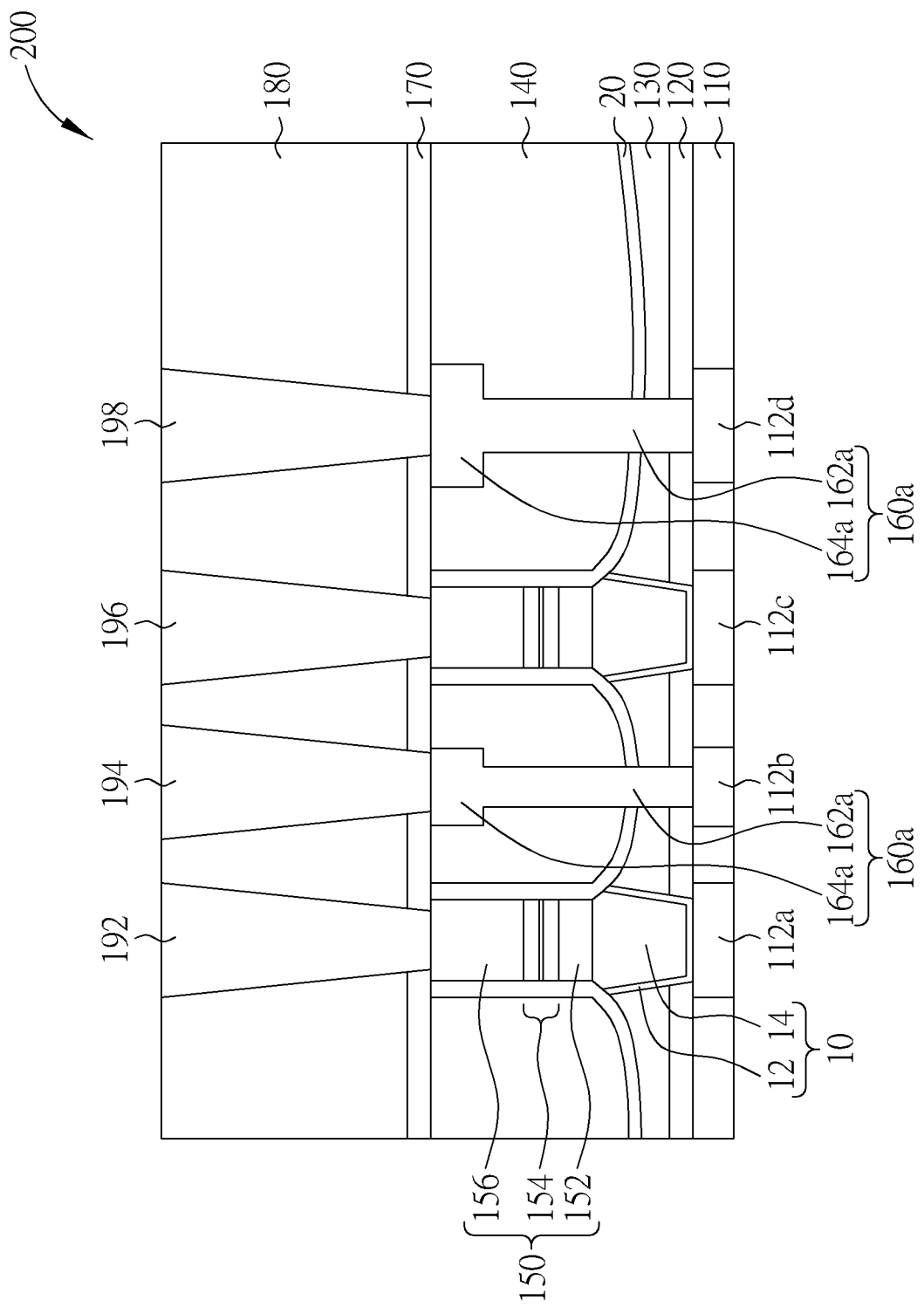
FIG. 2 schematically depicts a cross-sectional view of a magnetic tunnel junction (MTJ) device according to an embodiment of the present invention.
Figure 3:
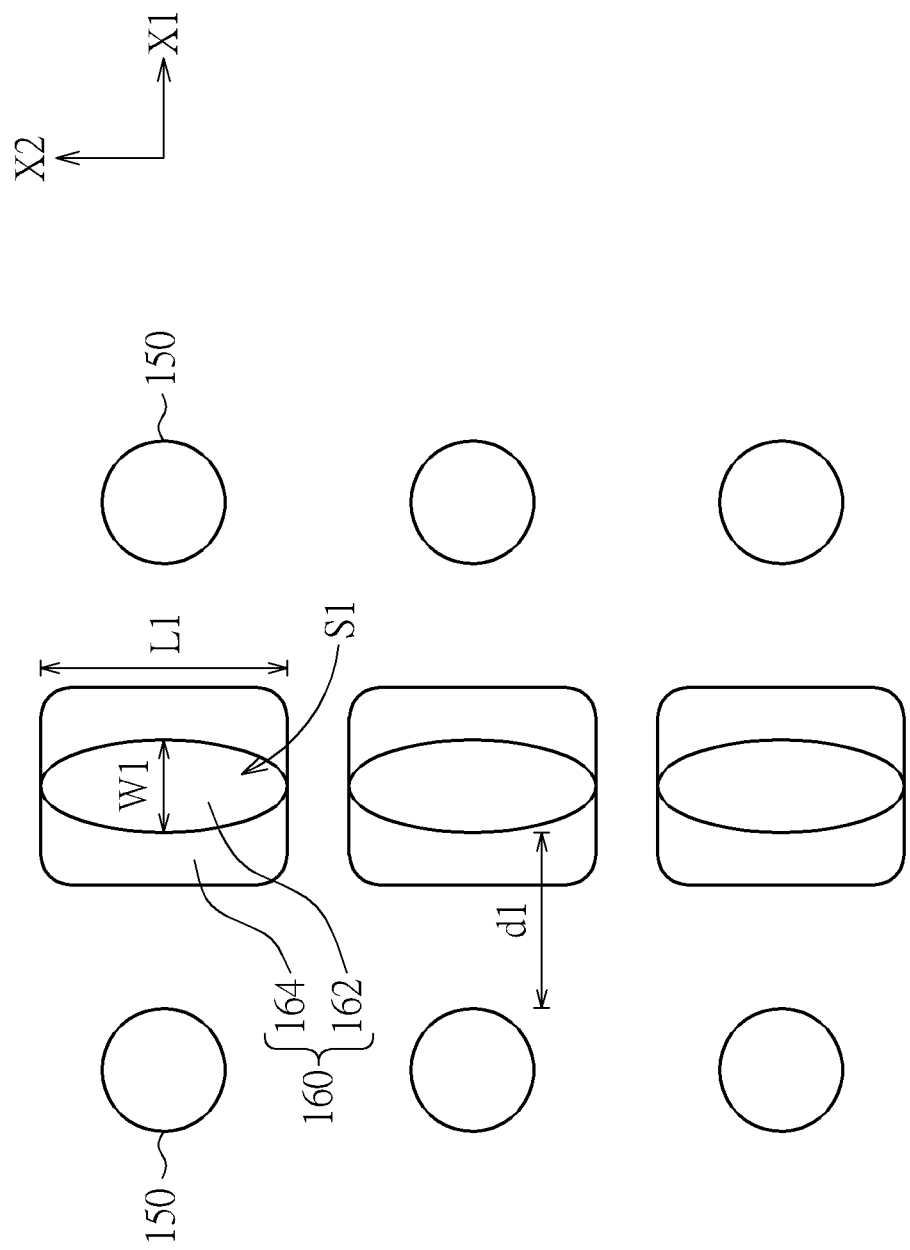
FIG. 3 schematically depicts a top view of a magnetic tunnel junction (MTJ) device according to an embodiment of the present invention.

By doing this, a magnetic tunnel junction (MTJ) device 100 of FIG. 1 or a magnetic tunnel junction (MTJ) device 200 of FIG. 2 can be carried out by said processing steps. Top views of the magnetic tunnel junction (MTJ) devices 100/200 of the present invention are presented as follows. FIG. 3 schematically depicts a top view of a magnetic tunnel junction (MTJ) device according to an embodiment of the present invention. This embodiment can not only correspond to a structure having the cross-sectional view of FIG. 1, but also correspond to a structure having the cross-sectional view of FIG. 2. As shown in FIG. 3, the magnetic tunnel junction elements 150 are arranged side by side at a first direction X1, and the metal interconnections 160 are located between the magnetic tunnel junction elements 150. The contact plug parts 162 of the metal interconnections 160 have long shapes S1 at a top view, and each of the long shapes S1 has a length L1 at a second direction X2 larger than a width W1 at the first direction X1, wherein the second direction X2 is orthogonal to the first direction X1. Thereby, the contact plug parts 162 have rectangular shapes, oval shapes or etc at the top view. The metal parts 164 and the magnetic tunnel junction elements 150 may have rectangular shapes, oval shapes, circular shapes or etc at the top view, depending upon practical requirements.

In this case, the contact plug parts 162 have oval shapes at the top view, the metal parts 164 have rectangular shapes at the top view, and the magnetic tunnel junction elements 150 have circular shapes at the top view, wherein the whole contact plug parts 162 are in the metal parts 164 at the top view. Since each of the contact plug parts 162 has the length L1 at the second direction X2 larger than the width W1 at the first direction X1, a distance between each of the contact plug parts 162 and the adjacent magnetic tunnel junction elements 150 can be increased to avoid short circuit. Meanwhile, the surface area of the contact plug parts 162 can be preserved to keep low contact resistance.

Figure 4:
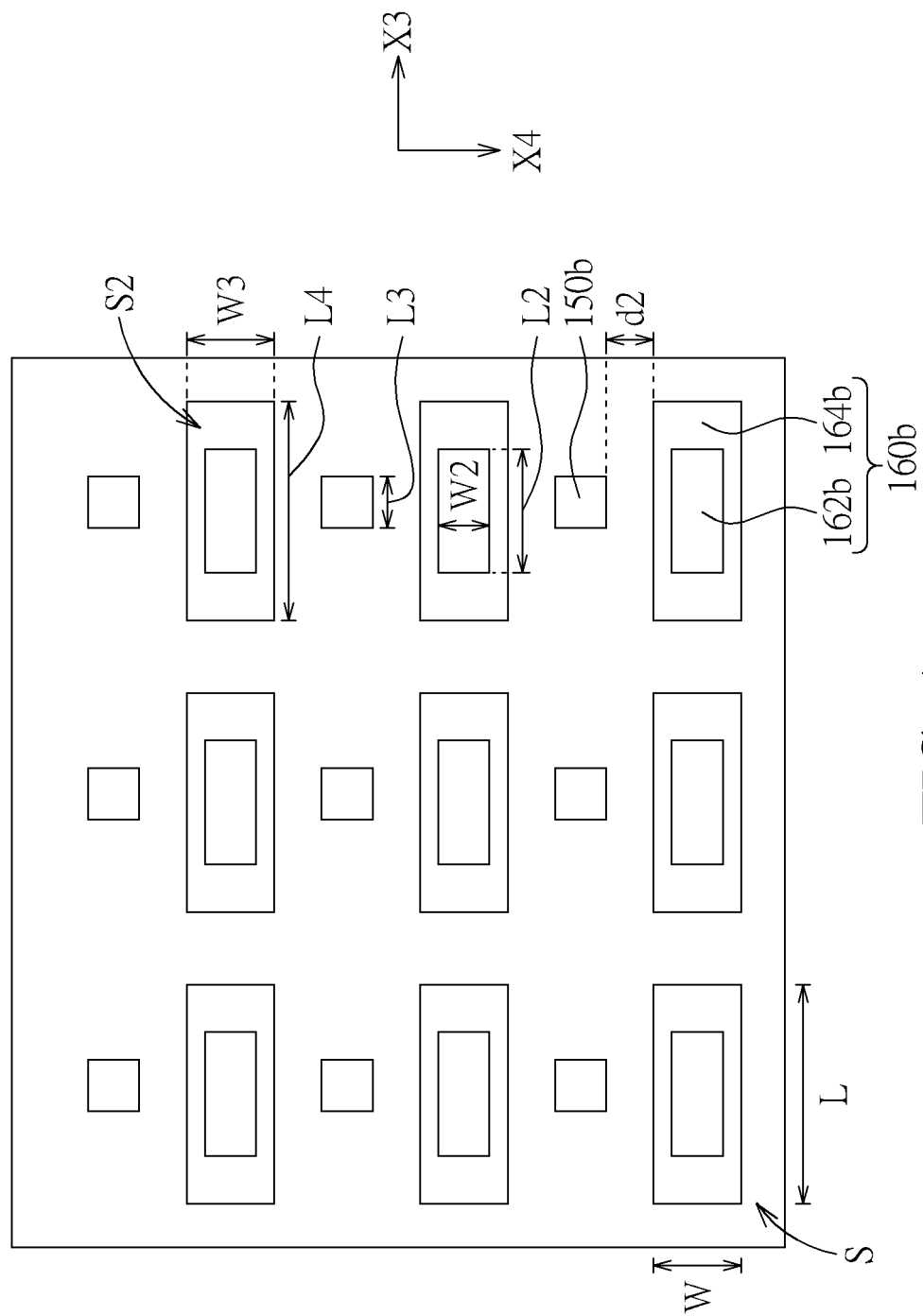
FIG. 4 schematically depicts a top view of a magnetic tunnel junction (MTJ) device according to an embodiment of the present invention.

Each of the contact plug parts 162 and the metal parts 164 can have a rectangular shape, an oval shape or others at the top view individually, to not only increase the distance between each of the contact plug parts 162 and the adjacent magnetic tunnel junction elements 150 but also maintain the surface area of the contact plug parts 162. In another case, as shown in FIG. 4, the contact plug parts 162 and the metal parts 164 are both rectangular shapes at the top view, the magnetic tunnel junction elements 150b are square shapes at the top view, and the whole contact plug parts 162 are in the metal parts 164 at the top view. Since each of the contact plug parts 162b has a length L2 at a second direction X3 larger than a width W1 at a first direction X4, a distance d2 between each of the contact plug parts 162b and the adjacent magnetic tunnel junction elements 150b can be increased to avoid short circuit. Meanwhile, the surface area of the contact plug parts 162b can be preserved to keep low contact resistance.

Preferably, the ratio of the length L2 of each of the contact plug parts 162b and the width W2 of each of the contact plug parts 162b is 1.9-2.6. In an embodiment, as the magnetic tunnel junction elements 150b have square shapes and a length L3 of a side of the square shapes at the top view is 50 nm, the length L2 of each of the contact plug parts 162b is at a range of 95-130 nm while the width W2 of each of the contact plug parts 162b is 50 nm, but it is not limited thereto. Still preferably, each of the metal parts 164b corresponding to the contact plug parts 162b has a long shape S2 at the top view, and a length L4 of the long shape S2 at the second direction X4 is larger than a width W3 at the first direction X4, for forming each of the contact plug parts 162b and the corresponding metal parts 164b stacked from bottom to top easily. The long shape S2 may be a rectangular shape, an oval shape or others. In a preferred embodiment, the ratio of the length L4 of each of the metal parts 164b and the width W3 of each of the metal parts 164b is 1.6-2.5. In this case, the length L4 of each of the metal parts 164b may be at a range of 145-225 nm while the width W3 of each of the metal parts 164b is 90 nm, but it is not limited thereto. By doing this, the device applied the present invention can be formed by nowadays processes easily.

In the embodiment of FIG. 1, each of the contact plug parts 162 and the corresponding metal parts 164 have tapered sidewalls broaden smoothly from bottom to top, therefore purposes of the present invention can be achieved by just restricting layouts of the metal interconnections 160. For example, as the top view of this embodiment is the top view of FIG. 4, each of the metal interconnections 160b have a long shape S at the top view, and a length L of the long shape S at the second direction X3 is larger than a width W at the first direction X4. The long shape S may be a rectangular shape, an oval shape or others.

Above all, the contact plug parts of the metal interconnections between the magnetic tunnel junction elements have long shapes at the top view. Besides, lengths of the long shapes at a direction orthogonal to a direction that the magnetic tunnel junction elements arranged side by side are larger than widths of the long shapes at the direction the magnetic tunnel junction elements arranged side by side. Thus, the distance between the contact plug parts and the adjacent magnetic tunnel junction elements can be increased to avoid short circuit while the surface area of the contact plug parts can be preserved to keep low contact resistance.

Figure 5:
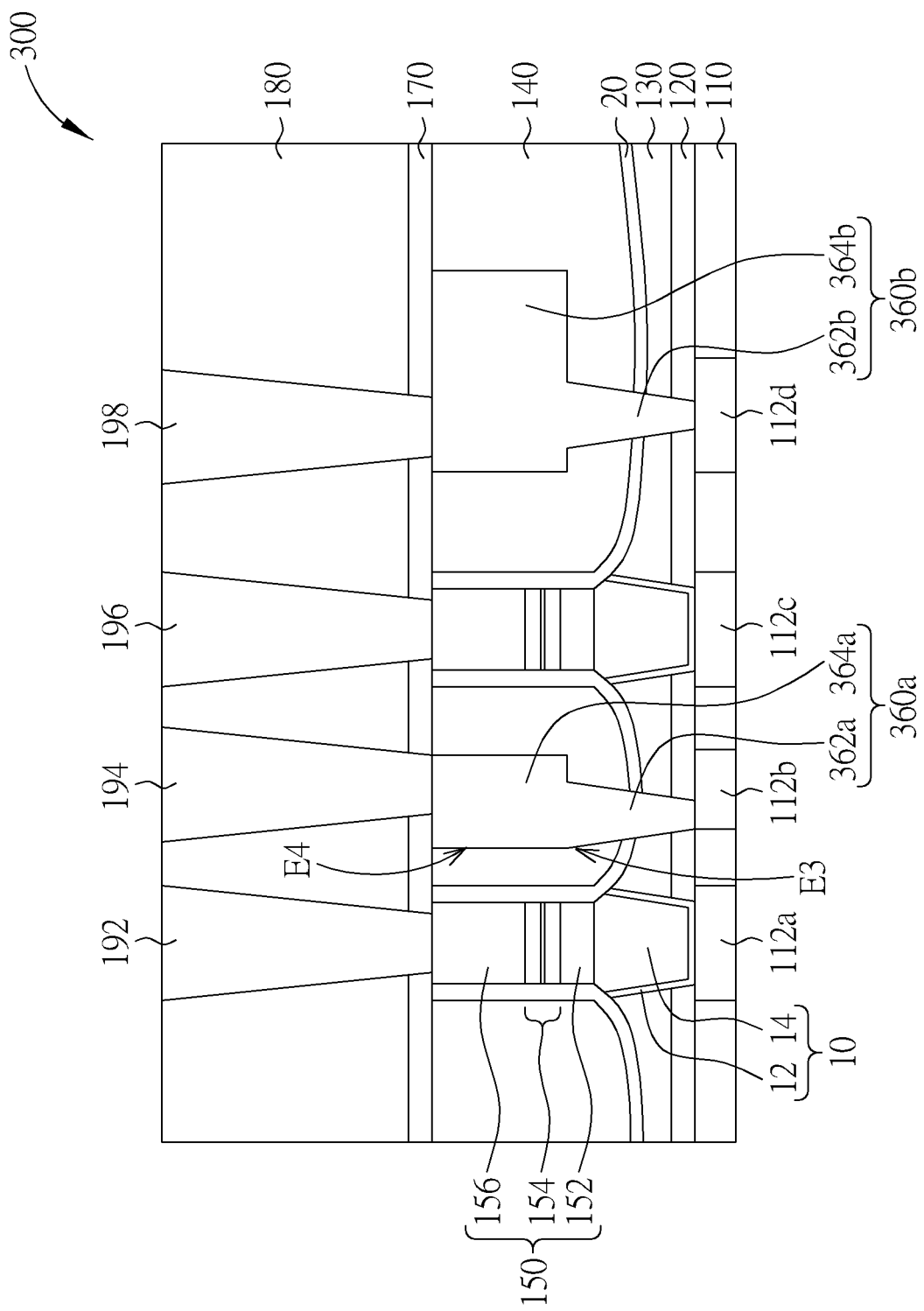
FIG. 5 schematically depicts a cross-sectional view of a magnetic tunnel junction (MTJ) device according to an embodiment of the present invention.

Moreover, an embodiment of a magnetic tunnel junction (MTJ) device is presented as follows. FIG. 5 schematically depicts a cross-sectional view of a magnetic tunnel junction (MTJ) device according to an embodiment of the present invention. As shown in FIG. 5, the difference between a magnetic tunnel junction (MTJ) device 300 and the magnetic tunnel junction (MTJ) device of FIG. 1 is in the following. The metal interconnection 360a may include a contact plug part 362a and a metal part 364a stacked from bottom to top, and the metal interconnection 360b may include a contact plug part 362b and a metal part 364b stacked from bottom to top. The metal interconnections 360a/360b may be formed by dual damascene processes, and the contact plug parts 362a/362b and the metal parts 364a/364b may have different or common sizes, but it is not restricted thereto. Methods of forming the magnetic tunnel junction (MTJ) device 300 of this embodiment are similar to the methods of forming the magnetic tunnel junction (MTJ) device 100 of FIG. 1 and the methods of forming the magnetic tunnel junction (MTJ) device 200 of FIG. 2, and thus are not described herein.

Figure 6:
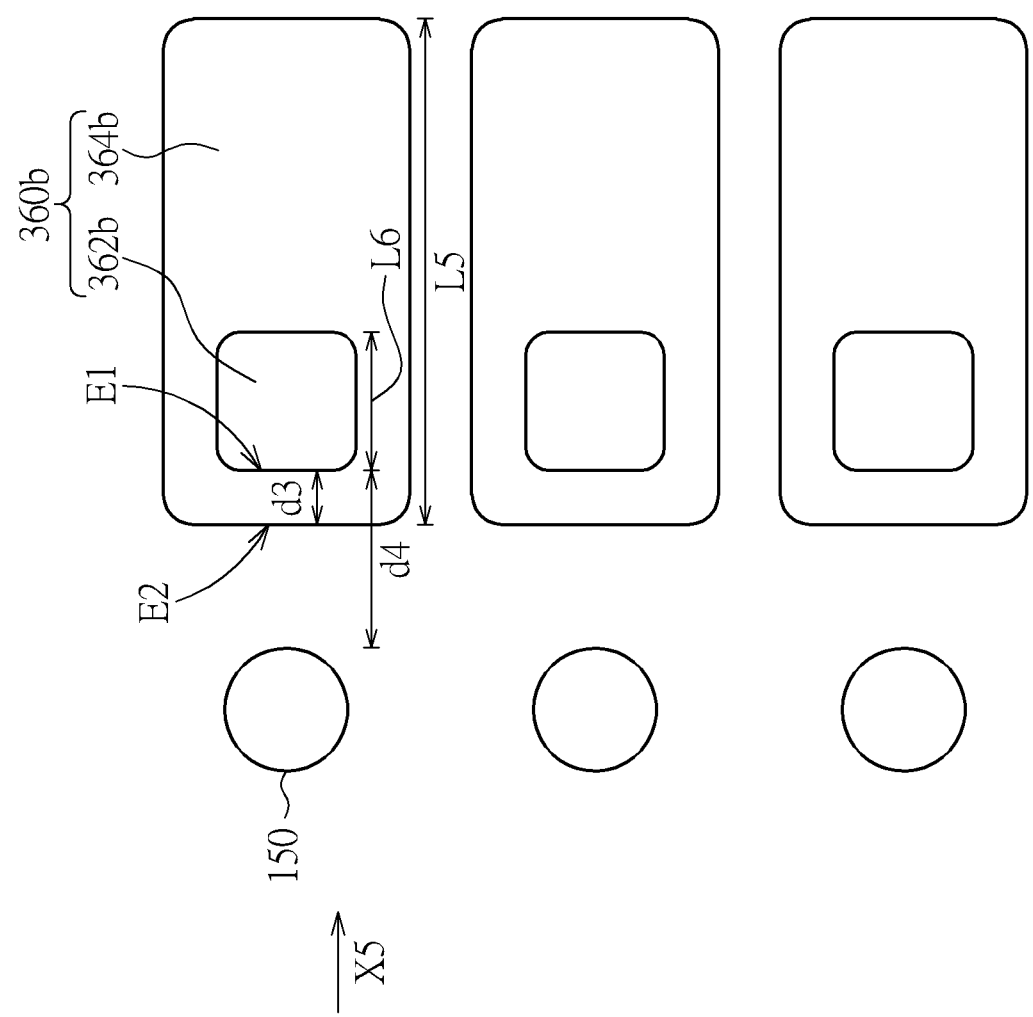
FIG. 6 schematically depicts a top view of a magnetic tunnel junction (MTJ) device according to an embodiment of the present invention.

An embodiment of layouts of the magnetic tunnel junction (MTJ) device 300 is presented as follows. FIG. 6 schematically depicts a top view of a magnetic tunnel junction (MTJ) device according to an embodiment of the present invention. As shown in FIG. 6, the whole contact plug parts 362b overlap the metal parts 364b at a top view, and a minimum distance d3 between an edge E1 of the contact plug parts 362b and an edge E2 of the corresponding metal parts 364b at a first direction X5 is equal to or larger than ⅕ of a length L5 of the corresponding metal parts 362b at the first direction X5. Please refer to FIG. 5 as well as FIG. 6, an edge E3 of the contact plug part 362a is trimmed to an edge E4 of the metal part 364a, and the contact plug part 362b of the metal interconnection 360b is shifted to make the minimum distance d3 between the edge E1 of the contact plug part 362b and the edge E2 of the metal part 364b at the first direction X5 be equal to or larger than ⅕ of the length L5 of the corresponding metal parts 364b at the first direction X5. Therefore, a distance d4 between each of the contact plug parts 362b and the adjacent magnetic tunnel junction elements 150 can be increased to avoid short circuit while the surface area of the contact plug parts can be preserved to keep low contact resistance.

Preferably, the contact plug parts 362b and the metal parts 364b are both rectangular shapes at the top view, or the contact plug parts 362b have square shapes at the top view while the metal parts 364b have rectangular shapes at the top view, for forming these structures easily. The magnetic tunnel junction elements 150 may have circular shapes at the top view, but it is not restricted thereto. The metal parts 364b and the magnetic tunnel junction elements 150 may have rectangular shapes, square shapes, circular shapes, oval shapes, or other shapes at the top view individually. In one case, the length L5 of each of the metal parts 364b may be 100 nm at the first direction X5, and the minimum distance between the edge E1 of each of the contact plug parts 362b and the edge E2 of the corresponding metal parts 364b at the first direction X5 is 20 nm. Preferably, a length L6 of a side of the contact plug parts 362b is 50 nm at the top view, but it is not limited thereto.

To summarize, the present invention provides a magnetic tunnel junction (MTJ) device, which includes two magnetic tunnel junction elements arranged side by side at a first direction, and a metal interconnection disposed between the two magnetic tunnel junction elements. In one case, the metal interconnection includes a contact plug part, the contact plug part has a long shape at a top view, and the long shape has a length at a second direction larger than a width at the first direction, wherein the second direction is orthogonal to the first direction. In another case, the metal interconnection includes a contact plug part and a metal part stacked from bottom to top, wherein the whole contact plug part overlaps the metal part at the top view, and the minimum distance between an edge of the contact plug part and an edge of the metal part at the first direction is equal to or larger than ⅕ of a length of the metal part at the first direction. In this way, the distance between the contact plug part and the adjust magnetic tunnel junction elements can be enlarged to avoid short circuit, and the surface area of the contact plug part can also be maintained to keep low contact resistance.

In a preferred embodiment, the contact plug part may have a rectangular shape or an oval shape. In a still preferred embodiment, the ratio of the length of the long shape and the width of the long shape is 1.9-2.6. For instance, the length of the contact plug part is at a range of 95-130 nm while the width of the contact plug part is 50 nm. The ratio of the length of the corresponding metal part and the width of the corresponding metal part is 1.6-2.5. For instance, a length of the corresponding metal part is at a range of 145-225 nm while the width of the corresponding metal part is 90 nm.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A magnetic tunnel junction (MTJ) device, comprising:
two magnetic tunnel junction elements arranged side by side at a first direction; and
a metal interconnection disposed between the two magnetic tunnel junction elements, wherein the metal interconnection comprises a contact plug part and a metal part stacked from bottom to top, the contact plug part has a long shape at a top view, and the long shape has a length at a second direction larger than a width at the first direction, wherein the second direction is orthogonal to the first direction, wherein the metal part has a second long shape at the top view, and the long shape has an oval shape while the second long shape has a rectangular shape, wherein the oval shape and the rectangular shape share a same central point, wherein the two magnetic tunnel junction elements and the metal interconnection are disposed at a same level.

2. The magnetic tunnel junction (MTJ) device according to claim 1, wherein the metal interconnection has a first long shape at the top view, and the first long shape has a length at the second direction larger than a width at the first direction.

3. The magnetic tunnel junction (MTJ) device according to claim 1, wherein the second long shape has a length at the second direction larger than a width at the first direction.

4. The magnetic tunnel junction (MTJ) device according to claim 1, wherein the two magnetic tunnel junction elements have square shapes at the top view.

5. The magnetic tunnel junction (MTJ) device according to claim 4, wherein a length of a side of the square shapes at the top view is 50 nm.

6. A magnetic tunnel junction (MTJ) device, comprising:
two magnetic tunnel junction elements arranged side by side at a first direction; and
a metal interconnection comprising a contact plug part and a metal part stacked from bottom to top disposed between the two magnetic tunnel junction elements, the contact plug part and the metal part both have rectangular shapes at the top view, and the minimum distance between an edge of the contact plug part and an edge of the metal part at the first direction is equal to or larger than ⅕ of a length of the metal part at the first direction, and wherein the two magnetic tunnel junction elements and the metal interconnection are disposed at a same level.

7. The magnetic tunnel junction (MTJ) device according to claim 6, wherein the length of the metal part at the first direction is 100 nm while the minimum distance between the edge of the contact plug part and the edge of the metal part at the first direction is 20 nm.

8. The magnetic tunnel junction (MTJ) device according to claim 6, wherein the contact plug part and the metal part both have rectangular shapes at the top view.

9. The magnetic tunnel junction (MTJ) device according to claim 6, wherein the contact plug part has a square shape at the top view while the metal part has a rectangular shape at the top view.

10. The magnetic tunnel junction (MTJ) device according to claim 9, wherein a length of a side of the contact plug part at the top view is 50 nm.

* * * * *